United States Patent
Mohamed et al.

(10) Patent No.: US 11,923,271 B2
(45) Date of Patent: Mar. 5, 2024

(54) 3D IC POWER GRID

(71) Applicant: Taiwan Semiconductor Manufacturing Company, Ltd., Hsinchu (TW)

(72) Inventors: Noor E. V. Mohamed, Hsinchu (TW); Fong-Yuan Chang, Hsinchu (TW); Po-Hsiang Huang, Hsinchu (TW); Chin-Chou Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 52 days.

(21) Appl. No.: 17/380,305

(22) Filed: Jul. 20, 2021

(65) Prior Publication Data

US 2021/0351110 A1    Nov. 11, 2021

Related U.S. Application Data

(63) Continuation of application No. 16/516,966, filed on Jul. 19, 2019, now Pat. No. 11,081,426.

(60) Provisional application No. 62/712,718, filed on Jul. 31, 2018.

(51) Int. Cl.
| | | |
|---|---|---|
| *H01L 23/48* | (2006.01) | |
| *H01L 21/822* | (2006.01) | |
| *H01L 23/00* | (2006.01) | |
| *H01L 25/065* | (2023.01) | |

(52) U.S. Cl.
CPC ........ *H01L 23/481* (2013.01); *H01L 21/8221* (2013.01); *H01L 24/17* (2013.01); *H01L 25/0657* (2013.01)

(58) Field of Classification Search
CPC ... H01L 23/481; H01L 21/8221; H01L 24/17; H01L 25/0657
See application file for complete search history.

(56) References Cited

U.S. PATENT DOCUMENTS

| | | |
|---|---|---|
| 8,552,563 B2 | 10/2013 | Law et al. |
| 9,741,691 B2 | 8/2017 | Lim et al. |
| 9,754,923 B1 | 9/2017 | Xie et al. |
| 2013/0187280 A1* | 7/2013 | Yuan ............... H01L 23/585 |
| | | 257/773 |
| 2015/0262989 A1 | 9/2015 | Kawasaki et al. |
| 2016/0093588 A1 | 3/2016 | Wang et al. |
| 2016/0181228 A1 | 6/2016 | Higuchi et al. |
| 2017/0177125 A1 | 6/2017 | Kim et al. |
| 2017/0186732 A1 | 6/2017 | Chu et al. |

(Continued)

FOREIGN PATENT DOCUMENTS

| | | |
|---|---|---|
| CN | 101859762 A | 10/2010 |
| CN | 103633061 A | 3/2014 |

(Continued)

*Primary Examiner* — Matthew L Reames
(74) *Attorney, Agent, or Firm* — Merchant & Gould P.C.

(57) ABSTRACT

A three dimensional Integrated Circuit (IC) Power Grid (PG) may be provided. The three dimensional IC PG may comprise a first IC die, a second IC die, an interface, and a power distribution structure. The interface may be disposed between the first IC die and the second IC die. The power distribution structure may be connected to the interface. The power distribution structure may comprise at least one Through-Silicon Vias (TSV) and a ladder structure connected to at least one TSV.

20 Claims, 6 Drawing Sheets

(56) References Cited

U.S. PATENT DOCUMENTS

2017/0207214 A1 7/2017 Or-Bach et al.
2018/0047716 A1 2/2018 Chao et al.

FOREIGN PATENT DOCUMENTS

| CN | 104916619 A | 9/2015 |
| CN | 107534039 A | 1/2018 |
| CN | 107667425 A | 2/2018 |
| KR | 10-2015-0097539 A | 8/2015 |
| KR | 10-2016-0036516 A | 4/2016 |
| KR | 10-2017-0073483 A | 6/2017 |
| KR | 10-2017-0078538 A | 7/2017 |
| TW | 201810567 A | 3/2018 |
| WO | 2014/100278 A1 | 6/2014 |

\* cited by examiner

3D IC POWER GRID

CROSS-REFERENCE TO RELATED APPLICATIONS

This application is a continuation of U.S. patent application Ser. No. 16/516,966, filed on Jul. 19, 2019, and entitled "3D IC Power Grid", the disclosure of which is hereby incorporated by reference in its entirety. This application also claims priority to U.S. Provisional Application No. 62/712,718, filed on Jul. 31, 2018, and entitled "3D IC Power Grid", of which the disclosure is hereby incorporated by reference in its entirety.

BACKGROUND

A vertically stacked integrated circuit may stack semiconductor dies on top of each other and may interconnect the semiconductor dies vertically using, for example, Through-Silicon Vias (TSVs). A vertically stacked integrated circuit may behave as a single integrated circuit or device that may have a smaller footprint than when a device is constructed with individual integrated circuits.

In some instances, power used by a circuit on a semiconductor die may vary over time. Additionally or alternatively, a signal supplied by a power supply may experience a loss (e.g., a voltage loss) when received by a circuit on a semiconductor die. A voltage loss may occur based at least in part on a resistance associated with a conductive path that a signal may travel from the power supply to the circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
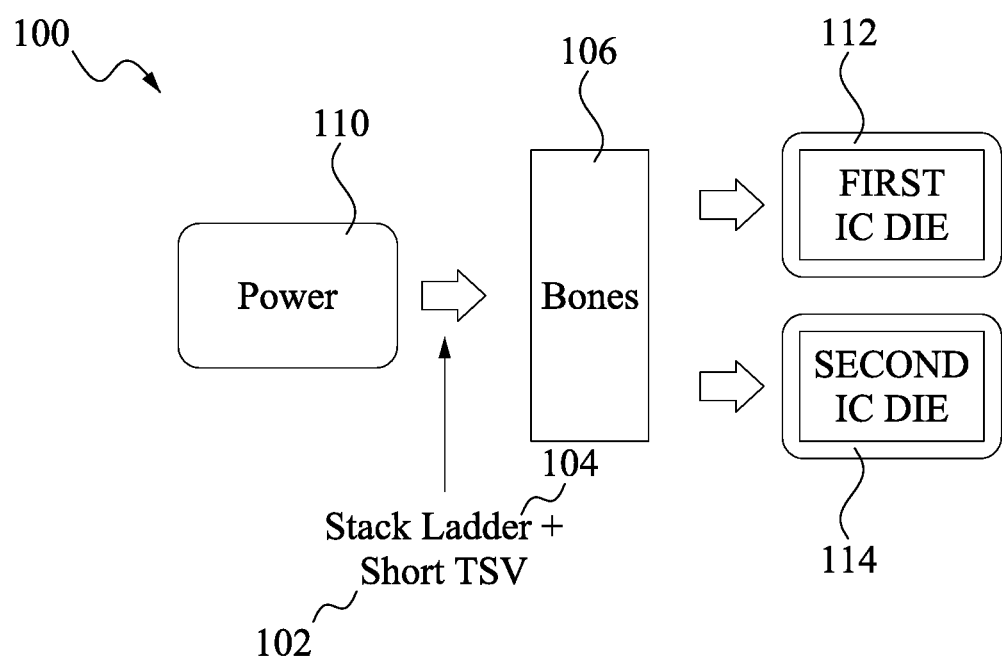
FIG. 1 is a block diagram that may illustrate a Three-Dimensional Integrated Circuit (3D IC) Power Grid (PG) that may minimize IR drop in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Three-Dimensional Integrated Circuit (3D IC) may comprise an integrated circuit that may be manufactured by stacking silicon wafers or dies and interconnecting them vertically so that they may behave as a single device to achieve performance improvements at reduced power and smaller footprint than conventional two dimensional processes. Through-Silicon Vias (TSVs), for example, may be employed for interconnecting the stacked devices.

For 3D IC designs, power consumption may be, for example, two times or three times as compared to the conventional 2D IC designs. Hence, a conventional 2D Power Grid (PG) may not be used in 3D IC designs. While TSV may provide a process for vertical interconnection in 3D IC technology, using TSV for power distribution networks (PDN) in Wafer-on-Wafer (WoW) designs may encounter challenges such as placement/routing resource reduction, IR drop, and high frequency inductive voltage fluctuations (i.e., L di/dt noise) through TSVs.

A problem with 3D PG processes is that they may not be suitable for Face-to-Face (F2F) die stacking due to the large IR drop in a second die. Embodiments of the disclosure may addresses issues related to such IR drop. Direct coupling of a power supply from packaging bumps to interface top metals through a combination of a short TSV, ladder network, and PG may be addressed by embodiments of the disclosure. Embodiments of the disclosure may distribute power from top metals to device layers through traditional 2D PG structure while achieving similar supply voltages in both dies of WoW topology for example. A combination of a short TSV, a grid ladder, and PG bones may distribute power supplied at the interface, such that the supply current goes through short TSV, the grid ladder, the PG Bones, and then to traditional 2D PG to go to the device layer in each of the dies.

PG TSVs may be connected to a metal layer (i.e., M1) pin in a first die where power signals may be propagated to top metal wires in a first die through alternative horizontal and vertical metal stacking. The second die stacked on top of the first die in a F2F configuration may receive power supply from the first die top metal layer through inter-die interface hybrid bumps. These signals may be propagated to the M1 layer in the second die through alternative horizontal and vertical metal stacking.

Another problem with 3D PG processes may be a large IR drop in the second die due to long metal stacking from the first die M1 pin to that in the second die. Embodiments of the disclosure may provide a solution for the IR drop in the second die through a direct connection of PG TSVs to top metals through a ladder network (e.g., a power distribution structure). Moreover, this process may be extended to more than two stacked dies to replace long TSV structures in 3D IC designs. Still further, resistance of the stacking grid ladder may be reduced by using a fat grid stacking connection for the ladder network. After place and routing processes, post routing for the PG connection may be conducted based on resources.

FIG. 1 is a block diagram that illustrates a 3D IC power grid 100 that may minimize IR drop. As shown in FIG. 1, embodiments of the disclosure may comprise a combination of a short TSV 102, a grid ladder 104, and PG 106 for distributing power from a power supply 110. Here, a supply current may go through the short TSV 102, the grid ladder 104, the PG 106, and then a 2D PG may be used to go to a device layer in each die (e.g. a first IC die 112 and a second IC die 114).

Figure 2:
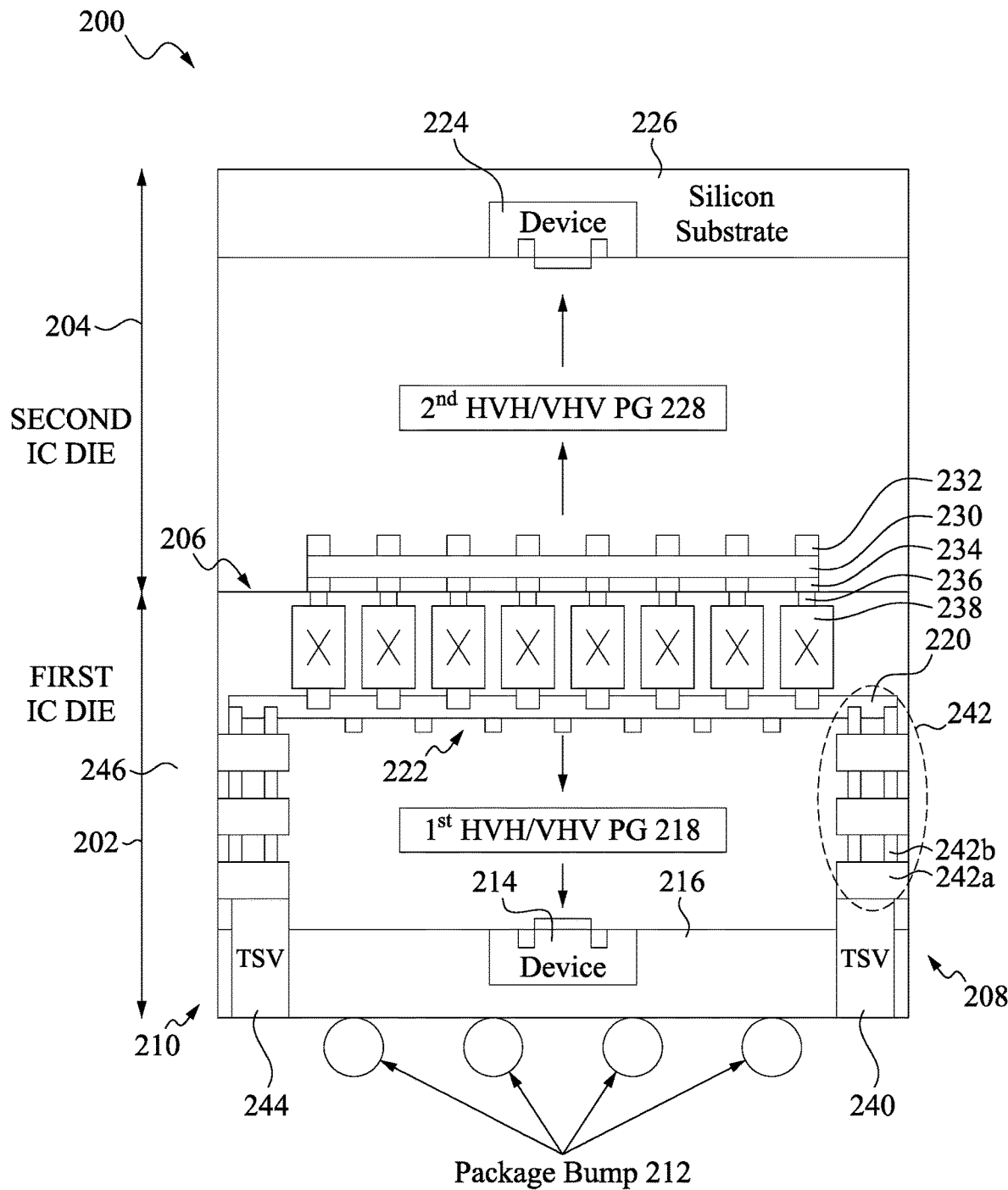
FIG. 2 illustrates a die stack using a 3D IC power grid in accordance with some embodiments.

FIG. 2 illustrates a die stack 200 using a 3D IC power grid consistent with embodiments of the disclosure. As shown in FIG. 2, the die stack 200 may comprise a first IC die 202, a second IC die 204, an interface 206, a first power distribution structure 208, a second power distribution structure 210, and a plurality of package bumps 212. The first IC die 202 may comprise a first functional element 214 (e.g., a device), a first silicon substrate 216, a first Horizontal Vertical Horizontal (HVH)/Vertical Horizontal Vertical (VHV) PG 218, a first IC die horizontal top metal layer 220, and a plurality of first vias 222. Similarly, the second IC die 204 may comprise a second functional element 224 (e.g., a device), a second silicon substrate 226, a second HVH/VHV PG 228, a second IC die horizontal top metal layer 230, and a plurality of second vias 232. The second IC die 204 may be stacked on first IC die 202, for example, in a F2F configuration.

The interface 206 may be disposed between the first IC die 202 and the second IC die 204. For example, the interface 206 may be disposed between the horizontal top metal layer 220 of the first IC die 202 and the horizontal top metal layer 230 of the second IC die 204. The interface 206 may comprise a plurality of hybrid layer pins 234 corresponding to second IC die 204, a plurality of hybrid layer bumps 236 corresponding to the first IC die 202, and a plurality of vertical top metal elements 238 corresponding to the first IC die 202. As shown in FIG. 2, the plurality of hybrid layer pins 234 may respectively and correspondingly connect to the plurality of hybrid layer bumps 236. Similarly, the plurality of hybrid layer bumps 236 may respectively and correspondingly connect to the plurality of vertical top metal elements 238. The plurality of hybrid layer pins 234 and the plurality of hybrid layer bumps 236 may comprise the PG 106 shown in FIG. 1. Accordingly, the interface 206 may provide a pathway for electrical power between the horizontal top metal layer 220 of the first IC die 202 and the horizontal top metal layer 230 of the second IC die 204.

The first power distribution structure 208 and the second power distribution structure 210 may be connected to the interface 206. The first power distribution structure 208 may comprise a first TSV 240 and a first ladder structure 242. Similarly, the second power distribution structure 210 may comprise a second TSV 244 and a second ladder structure 246. The first TSV 240 and the second TSV 244 may be connected to ones of the plurality of package bumps 212.

Electrical current used to power the die stack 200 may be fed to ones of the plurality of package bumps 212. As shown in FIG. 2, the first power distribution structure 208 and the second power distribution structure 210 may be disposed within and may pass through the first IC die 202. Consistent with embodiments of the disclosure, the first ladder structure 242 and the second ladder structure 246 may each comprise a plurality of horizontal elements 242a connected by a plurality of vertical elements 242b. The plurality of horizontal elements 242a and the plurality of vertical elements 242b comprising the first ladder structure 242 and the second ladder structure 246 may be constructed using the horizontal and vertical layers of the first IC die 202.

Consistent with embodiments of the disclosure, a direct coupling of a power supply from the packaging bumps 212 to the horizontal top metal layer 220 of the first IC die 202 and the horizontal top metal layer 230 of the second IC die 204 may be provided. This direct coupling may be provided through the first power distribution structure 208 and the second power distribution structure 210 comprising a combination of a short TSV and a stack ladder (e.g., ladder structure). Embodiments of the disclosure then may distribute power from the horizontal top metal layer 220 of the first IC die 202 and the horizontal top metal layer 230 of the second IC die 204 through the first HVH/VHV PG 218 and the second HVH/VHV PG 228 respectively. The power may be supplied while achieving similar supply voltages in the first IC die 202 and the second IC die 204 of WoW topology of the die stack 200. Accordingly, embodiments of the disclosure may provide a solution for IR drop in the second IC die 204 through a direct connection of PG TSVs to top metals of the first IC die 202 and the second IC die 204 through power distribution structures (i.e., the first power distribution structure 208 and the second power distribution structure 210).

The first IC die horizontal top metal layer 220's width dimension may vary with the particular process technology node used, but in some example implementations it may range from 0.45 um to 10.8 um. The length of the first IC die horizontal top metal layer 220 may depend on the chip dimension used, while thickness may be approximately 1.25 um in some embodiments. The plurality of first vias 222 may have a width and length of approximately 0.8 um by 0.8 um, for example. The second IC die horizontal top metal layer 230's width dimension may vary with the process technology node used, but in some example implementations it may range from 0.45 um to 10.8 um. The length of the second IC die horizontal top metal layer 230 may depend on the chip dimension used, while thickness may be approximately 1.25 um. The plurality of second vias 232 may have a width and length of approximately 0.8 um by 0.8 um, for example. Examples of the plurality of hybrid layer pins 234 may have a width and length of approximately 0.4 um by 0.4 um. The plurality of hybrid layer bumps 236 and the plurality of vertical top metal elements 238 may each have a width and length of approximately 0.8 um by 0.8 um. First TSV 240 and second TSV 244 may be circular and may have a radius of approximately 0.5 um.

Materials used for any of the metal elements in the die stack 200, for example, the first IC die horizontal top metal layer 220, the first plurality of vias 222, the second IC die horizontal top metal layer 230, the second plurality of vias 232, the plurality of hybrid layer pins 234, the plurality of hybrid layer bumps 236, the plurality of vertical top metal elements 238, and elements comprising the first power distribution structure 208 and the second power distribution structure 210 may comprise, but are not limited to, Copper (Cu), Nickel (Ni), a Tin-Silver-Copper (SnAgCu) alloy, or a Gold-Tin (AuSn) alloy. Materials used for any of the non-metal elements (e.g., dielectrics) in the die stack 200 may comprise, but are not limited to, Silicon Dioxide (SiO2) and Silicon Mononitride (SiN). The first IC die 202 and the second IC die 204 may be stacked, for example, in a F2F configuration and bonded together by hybrid bonding for example. Hybrid bonds may comprise bonds that rely upon the formation of metal bonds and dielectric bonds at substantially the same time.

Figure 3:
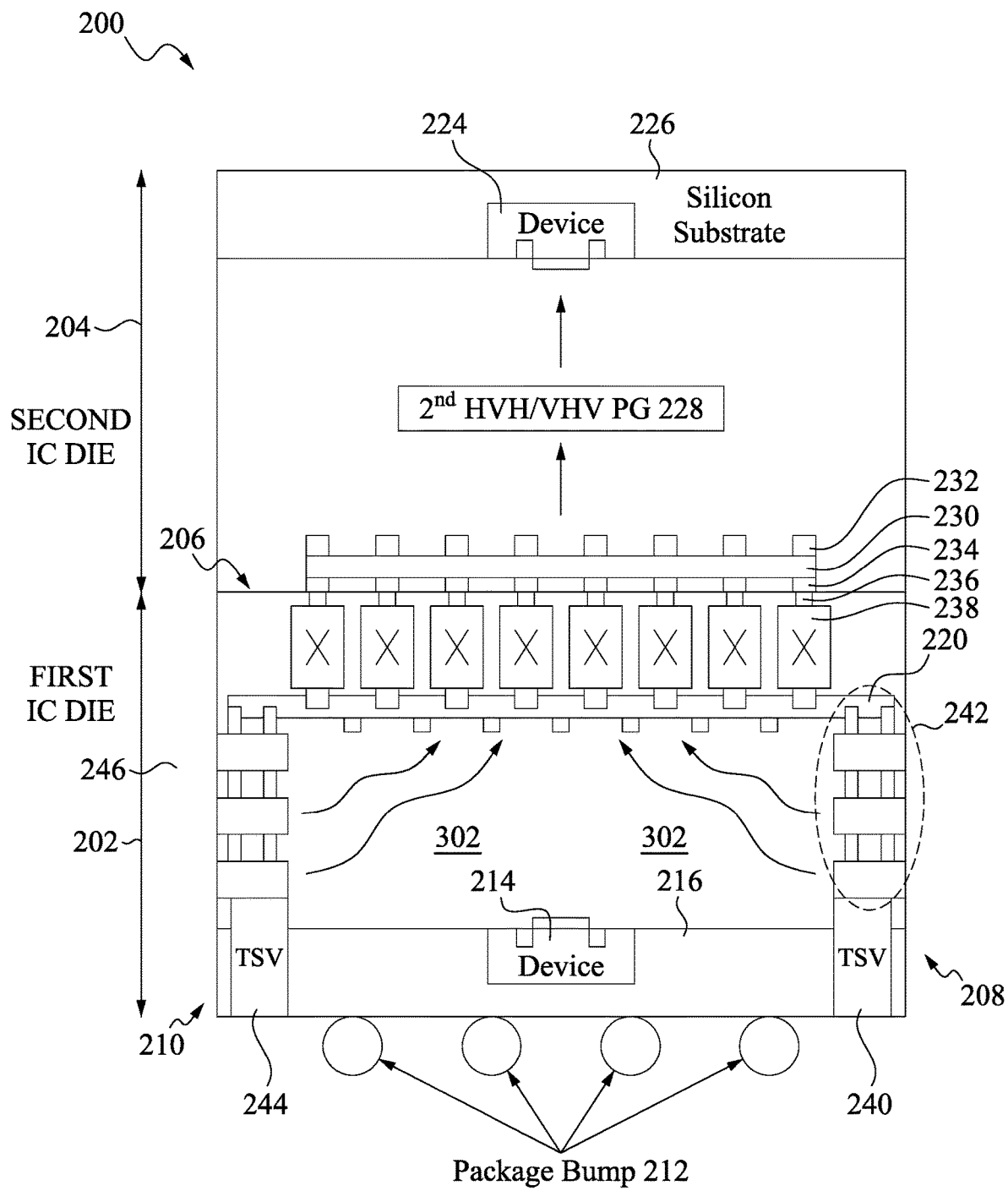
FIG. 3 illustrates another embodiment of the die stack in accordance with some embodiments.

FIG. 3 illustrates another embodiment of the die stack 200. With the embodiment shown in FIG. 3, elements or structures of first power distribution structure 208 and second power distribution structure 210 may be extended into the PG of the first IC die 202 to address IR drop issues. For example, if there are IR drop issues occurring in the first IC die 202, elements within the first ladder structure 242 or the second ladder structure 246 may be directly extended by pathways 302 into the PG of the first IC die 202 to address IR drop issues. In other words, direct connections may be provided from elements of the first ladder structure 242 and/or the second ladder structure 246 to the first IC die horizontal top metal layer 220 to address IR drop issues in the first IC die 202.

Figure 4:
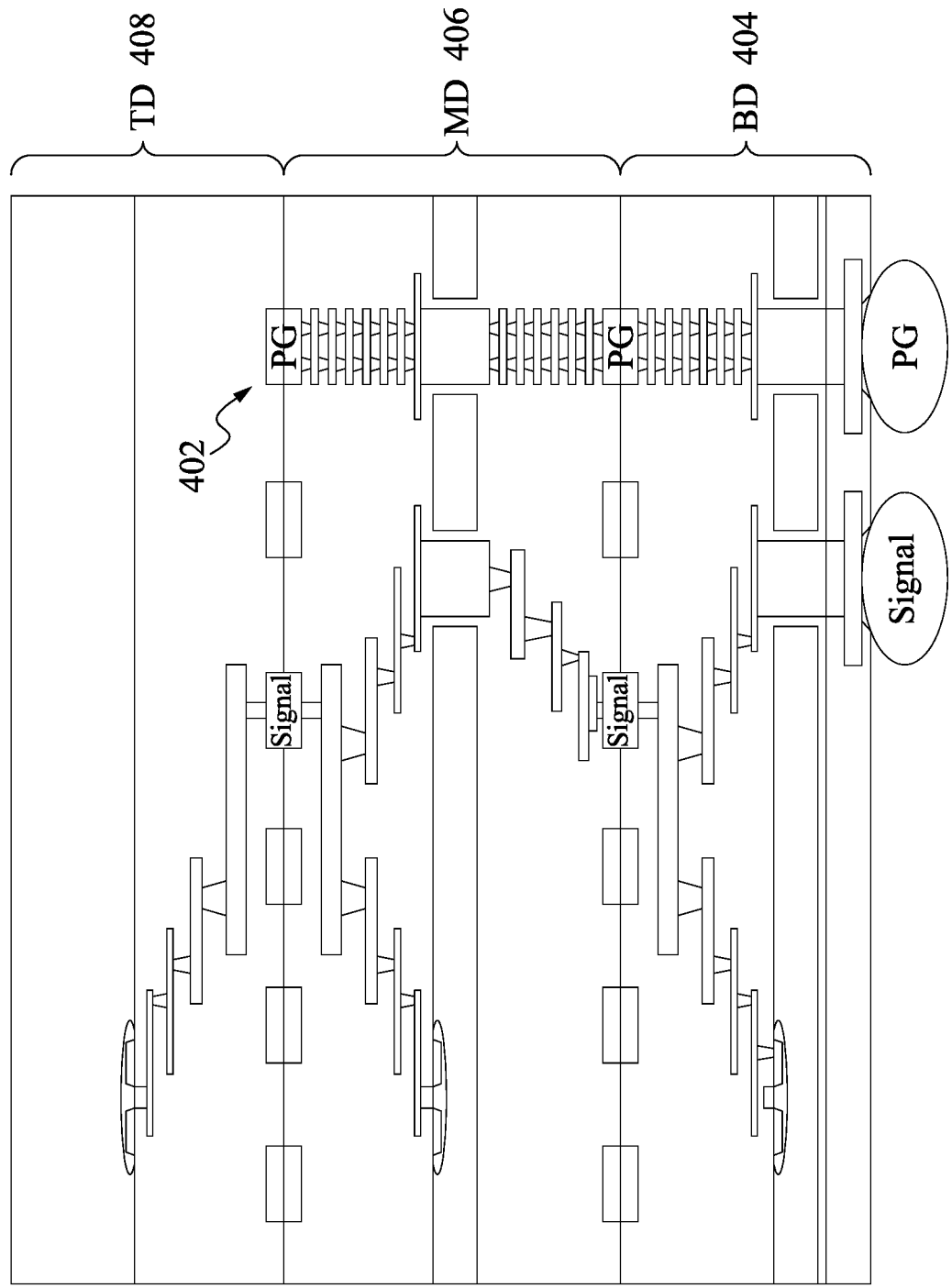
FIG. 4 illustrates a plurality of IC dies that may be stacked in accordance with some embodiments.

FIG. 4 illustrates an embodiment of the disclosure in which a plurality of IC dies may be stacked. As shown in FIG. 4, a power distribution structure 402 (e.g., similar to the aforementioned power distribution structures) may be extended through a bottom IC die 404, a middle IC die 406, and to a top IC die 408. Accordingly, embodiments of the disclosure may be extended to any number of IC dies and is not limited to two IC dies.

Figure 5:
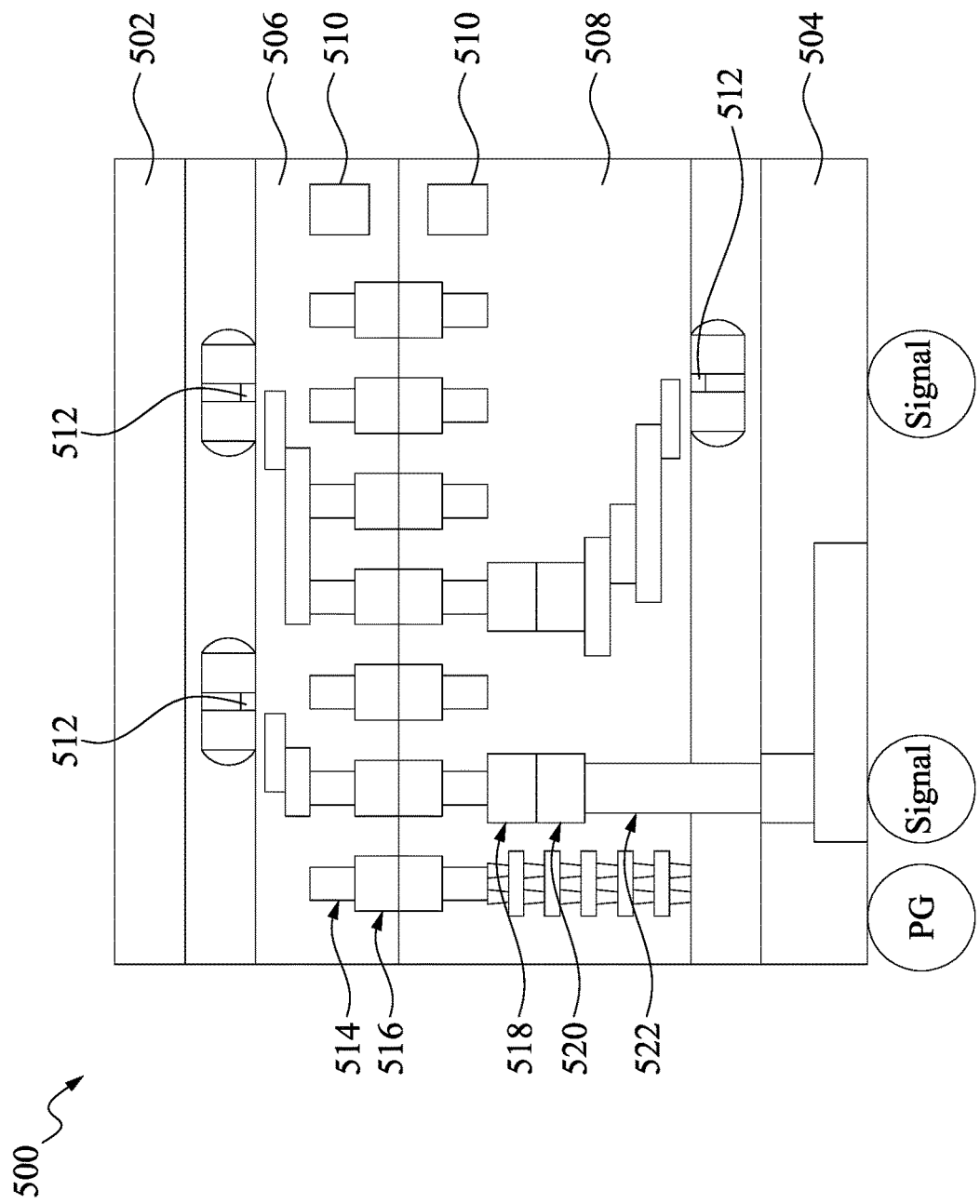
FIG. 5 illustrates a Small Outline Integrated Chip (SoIC) in accordance with some embodiments.

FIG. 5 illustrates an integrated circuit device in accordance consistent with the present disclosure, which in some embodiments may include a system on an integrated chip (SoIC) 500. As shown in FIG. 5, SoIC 500 may comprise a bottom wafer 502, a top wafer 504, a bottom die 506, top die(s) 508, and access points (APs) 510. Access points 510 may be used for testing. SoIC 500 may further comprise a Bonding Pad Via (BPV) 514, a Bonding pad metal (BPM) 516, a Top Metal 1 (TM1) layer 518, a Top Metal 2 (TM2) layer 520, and a TSV 522. SoIC 500 may be provided with a long TSV 522. This long TSV 522 may directly go to TM1 layer 518 through silicon, where as a short TSV may only penetrate silicon and through the first metal layer. This long TSV 522 structure also reduces the IR drop issue caused by short TSVs. With this embodiment, the power source current may directly reach to the inter die interface quickly through long TSV 522 and there it can distribute power to top die 508 and bottom die 506.

Figure 6:
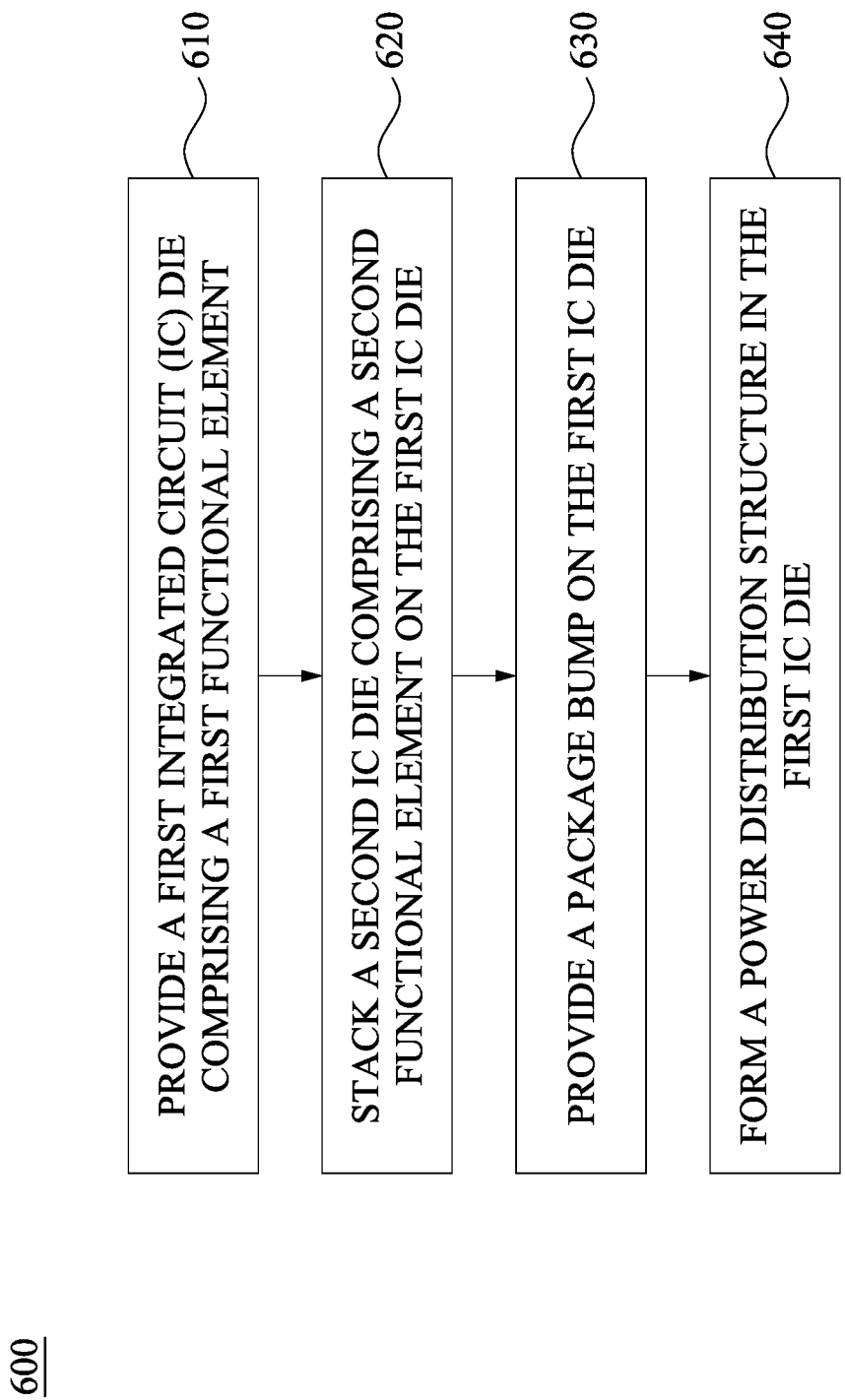
FIG. 6 is a flow chart of a method for providing a 3D IC power grid in accordance with some embodiments.

FIG. 6 is a flow chart setting forth the general operations involved in a method 600 consistent with an embodiment of the disclosure for providing a 3D IC power grid. Ways to implement the operations of method 600 will be described in greater detail below. The method 600 may begin and proceed to operation 610, where the first IC die 202 comprising the first functional element 214 may be provided. From operation 610, where the first IC die 202 comprising the first functional element 214 is provided, method 600 may advance to operation 620 where the second IC die 204 comprising the second functional element 224 may be stacked on the first IC die 202. For example, the second IC die 204 may be stacked on the first IC die 202 in a face-to-face configuration.

Once the second IC die 204 comprising the second functional element 224 is stacked on the first IC die 202 in operation 620, the method 600 may continue to operation 630 where the package bumps 212 may be provided on the first IC die 202. For example, a power supply may be coupled to the package bumps 212 and the package bumps 212 may receive an electrical current from the power supply.

After the package bump 212 are provided on the first IC die 202 in operation 630, the method 600 may proceed to operation 640 where a power distribution structure may be formed in the first IC die 202. The electrical current may be conducted through the power distribution structure (e.g., the first power distribution structure 208 or the second power distribution structure 210) formed in the first IC die 202.

A power supply may be coupled to package bump 212 to supply an electrical current to the power distribution structure and then from the power distribution structure to the horizontal top metal layer 220 of the first IC die 202 and to the interface 206. The electrical current supplied by the power supply may be conducted through the power distribution structure that may comprise a plurality of TSVs (e.g., the first TSV 240 and the second TSV 244) in the power distribution structure and through a ladder structure (e.g., the first ladder structure 242 and the second ladder structure 246) connected to the plurality of TSVs. For example, power may be supplied from the horizontal top metal layer 220 of the first IC die 202 and the horizontal top metal layer 230 of the second IC die 204 through the first HVH/VHV PG 218 and the second HVH/VHV PG 228 respectively. The power may be supplied while achieving similar supply voltages in the first IC die 202 and the second IC die 204. Once the power distribution structure (e.g., the first power distribution structure 208 or the second power distribution structure 210) is formed in the first IC die 202 in operation 640, the method 600 may then end.

Consistent with embodiments of the disclosure, a direct coupling of a power supply from packaging bumps to an interface top metals through a structure comprising a combination of a short TSV, a stack ladder (e.g., ladder structure), and PG bones may be provided. This structure may distribute power from top metals to device layers through conventional 2D PG structures while achieving similar supply voltages in all dies of a WoW topology.

An embodiment of the disclosure may comprise a three dimensional Integrated Circuit (IC) Power Grid (PG). The three dimensional IC PG may comprise a first IC die, a second IC die, an interface, and a power distribution structure. The interface may be disposed between the first IC die and the second IC die. The power distribution structure may be connected to the interface. The power distribution structure may comprise a plurality of Through-Silicon Vias (TSVs) and a ladder structure connected to the plurality of TSVs.

Another embodiment of the disclosure may comprise a three dimensional IC PG. The three dimensional IC PG may comprise a first IC die, a second IC die, an interface, and a power distribution structure. The interface may be disposed between the first IC die and the second IC die. The power distribution structure may be connected to the interface wherein the power distribution structure may pass through the first IC die. The power distribution structure may comprise a plurality of Through-Silicon Vias (TSVs) and a ladder structure connected to the plurality of TSVs. The ladder structure may comprise a plurality of horizontal elements connected by a plurality of vertical elements.

Yet another embodiment of the disclosure may comprise a method for providing a 3D IC power grid. A first integrated circuit (IC) die comprising a first functional element may be provided. Then a second IC die comprising a second functional element may be stacked on the first IC die. Next, an electrical current may be received at a package bump on the first IC die. The electrical current may then be distributed through a power distribution structure formed in the first IC die. Distributing the electrical current through the power distribution structure may comprise distributing the electrical current through a plurality of TSVs in the power distribution structure and through a ladder structure connected to the plurality of TSVs. The ladder structure may comprise a plurality of horizontal elements connected by a plurality of vertical elements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a first integrated circuit (IC) die;
   a second IC die on the first IC die;
   a first package bump on the first IC die, the first package bump connected to a power supply;
   a second package bump on the first IC die, the second package bump connected to the power supply;
   a power distribution structure in the first IC die, the power distribution structure comprising:
     a first Through-Silicon Via (TSV) connected to the first package bump,
     a first ladder structure connected to the first TSV,
     a second TSV connected to the second package bump, and
     a second ladder structure connected to the second TSV; and
   an interface disposed between the first die and the second IC die, wherein the interface connects the first ladder structure and the second ladder structure to a plurality of vertical top metal elements of the second IC die, and wherein each of the first ladder structure and the second ladder structure comprises a plurality of horizontal elements connected by a plurality of vertical elements.

2. The apparatus of claim 1, wherein the second IC die is stacked on the first IC die in a face-to-face configuration.

3. The apparatus of claim 1, wherein the power distribution structure is connected to the interface disposed between a horizontal top metal layer of the first IC die and a horizontal top metal layer of the second IC die.

4. The apparatus of claim 1, wherein a third IC die is connected to the interface.

5. The apparatus of claim 1, wherein the power distribution structure is configured to supply power to the first IC die and to the second IC die.

6. The apparatus of claim 1, wherein the power distribution structure passes through the first IC die.

7. The apparatus of claim 1, wherein the interface comprises a plurality of hybrid layer pins corresponding to the second IC die.

8. The apparatus of claim 1, wherein the interface comprises a plurality of hybrid layer bumps corresponding to the first IC die.

9. The apparatus of claim 1, wherein the first IC die comprises a first functional element.

10. The apparatus of claim 1, wherein the second IC die comprises a second functional element on the first IC die.

11. An apparatus comprising:
    a first package bump on a first integrated circuit (IC) die, the first package bump connected to a power supply;
    a second package bump on the first IC die, the second package bump connected to the power supply, wherein a second IC die is stacked on the first IC die in a face-to-face configuration;
    a power distribution structure in the first IC die, the power distribution structure comprising:
      a first Through-Silicon Via (TSV) connected to the first package bump,
      a first ladder structure connected to the first TSV,
      a second TSV connected to the second package bump, and
      a second ladder structure connected to the second TSV; and
    an interface disposed between the first IC die and the second IC die, wherein the interface connects the first ladder structure and the second ladder structure to a plurality of vertical top metal elements of the second IC die, and wherein each of the first the ladder structure and the second ladder structure comprises a plurality of horizontal elements connected by a plurality of vertical elements.

12. The apparatus of claim 11, wherein a third IC die is connected to the interface.

13. The apparatus of claim 11, wherein the power distribution structure is configured to supply power to the first IC die and to the second IC die.

14. The apparatus of claim 11, wherein the power distribution structure passes through the first IC die.

15. An apparatus comprising:
    a first package bump on a first integrated circuit (IC) die, the first package connected to a power supply;
    a second package bump on the first IC die, the second package bump connected to the power supply, wherein a second IC die is stacked on the first IC die in a face-to-face configuration;
    a power distribution structure in the first IC die, the power distribution structure comprising:
      at least one Through-Silicon Via (TSV) connected to the first package bump or the second package bump, and
      a ladder structure connected to the at least one TSV; and
    an interface disposed between the first IC die and the second IC die, wherein the interface connects the ladder structure to a plurality of vertical top metal elements of the second IC die, and wherein the ladder structure comprises a plurality of horizontal elements connected by a plurality of vertical elements.

16. The apparatus of claim 15, wherein the interface comprises a plurality of hybrid layer pins corresponding to the second IC die.

17. The apparatus of claim 15, wherein the first IC die comprises a first functional element.

18. The apparatus of claim 15, wherein the interface comprises a plurality of hybrid layer bumps corresponding to the first IC die.

19. The apparatus of claim 15, wherein the interface comprises a plurality of vertical top metal elements corresponding to the first IC die.

20. The apparatus of claim 15, wherein the power distribution structure passes through the first IC die.

* * * * *